United States Patent

Bhattacharya et al.

Patent Number: 5,871,630
Date of Patent: *Feb. 16, 1999

[54] PREPARATION OF COPPER-INDIUM-GALLIUM-DISELENIDE PRECURSOR FILMS BY ELECTRODEPOSITION FOR FABRICATING HIGH EFFICIENCY SOLAR CELLS

[75] Inventors: Raghu N. Bhattacharya, Littleton; Falah S. Hasoon, Arvada; Holm Wiesner, Golden; James Keane, Lakewood; Rommel Noufi, Golden; Kannan Ramanathan, Golden, all of Colo.

[73] Assignee: Davis, Joseph & Negley, Austin, Tex.

[*] Notice: The term of this patent shall not extend beyond the expiration date of Pat. No. 5,730,852.

[21] Appl. No.: 870,081

[22] Filed: Jun. 5, 1997

Related U.S. Application Data

[63] Continuation-in-part of Ser. No. 571,150, Dec. 12, 1995, Pat. No. 5,730,852.

[60] Provisional application No. 60/044,506 Apr. 21, 1997 and provisional application No. 60/004,269 Sep. 25, 1995.

[51] Int. Cl.$^6$ .................................................. C23C 28/02
[52] U.S. Cl. .......................... 205/192; 136/264; 136/265; 205/102
[58] Field of Search .................................. 205/192, 102; 437/170, 172; 136/264, 265

[56] References Cited

U.S. PATENT DOCUMENTS

| | | | |
|---|---|---|---|
| 3,530,053 | 9/1970 | Scott et al. | 204/157.1 |
| 3,978,510 | 8/1976 | Kasper et al. | 357/30 |
| 4,256,544 | 3/1981 | Kazacos et al. | 204/2.1 |
| 4,335,266 | 6/1982 | Mickelsen et al. | 136/260 |
| 4,376,016 | 3/1983 | Fawcett et al. | 204/14 N |
| 4,392,451 | 7/1983 | Mickelsen et al. | 118/690 |
| 4,581,108 | 4/1986 | Kapur et al. | 204/37.1 |
| 4,611,091 | 9/1986 | Choudary et al. | 136/260 |
| 4,798,660 | 1/1989 | Ermer et al. | 204/192.17 |
| 4,915,745 | 4/1990 | Pollock et al. | 136/265 |
| 5,045,409 | 9/1991 | Eberspacher et al. | 428/620 |
| 5,112,410 | 5/1992 | Chen | 136/260 |
| 5,221,660 | 6/1993 | Itozaki et al. | 505/1 |
| 5,356,839 | 10/1994 | Tuttle et al. | 437/225 |
| 5,436,204 | 7/1995 | Albin et al. | 437/225 |
| 5,441,897 | 8/1995 | Noufi et al. | 437/5 |
| 5,730,852 | 3/1998 | Bhattacharya et al. | 205/192 |

OTHER PUBLICATIONS

Solar Cells, 16(1986) 237–243—Electrodeposition of CuInX (X=Se, Te) Thin Films—R.N. Bhattacharya et al. no month available.

Solar Cells, 21(1987) 65–72—Low Cost Methods for the Production of Semiconductor Films for $CuInSe_2$/CdS Solar Cells—Kapur et al. no month available.

Solar Energy Materials 16(1987) 447–485—Electrochemical Synthesis of Photoactive $In_2Se_3$ Thin Films—J. Herrero et al. no month available.

(List continued on next page.)

Primary Examiner—Kathryn Gorgos
Assistant Examiner—Edna Wong
Attorney, Agent, or Firm—Oppenheimer Wolff & Donnelly LLP

[57] ABSTRACT

A photovoltaic cell exhibiting an overall conversion efficiency of 13.6% is prepared from a copper-indium-gallium-diselenide precursor thin film. The film is fabricated by first simultaneously electrodepositing copper, indium, gallium, and selenium onto a glass/molybdenum substrate (12/14). The electrodeposition voltage is a high frequency AC voltage superimposed upon a DC voltage to improve the morphology and growth rate of the film. The electrodeposition is followed by physical vapor deposition to adjust the final stoichiometry of the thin film to approximately $Cu(In_{1-n}Ga_x)Se_2$, with the ratio of Ga/(In+Ga) being approximately 0.39.

16 Claims, 8 Drawing Sheets

OTHER PUBLICATIONS

A 17.1%—Efficient Cu(In,Ga)Se$_2$–Based Thin–Film Solar Cell—J.R. Tuttle et al.—Progress in Photovoltaics—Jul.–Aug. 1995.

Solar Cells, 24 (1988) 91–102, Device Quality Thin Films of CuInSe$_2$ by a One–Step Electrodeposition Process—F.J. Pern et al. no month available.

J. Electrochem. Soc.: Electrochemical Science and Technology—Oct. 1983, 2040–42—Solution Growth and Electrodeposited CuInSe$_2$ Thin Films.

Solar Energy Materials 25 (1991) 31–45—Optical Properties of Electrochemically Deposited CuInSe$_2$ Thin Films—C. Guillén et al. no month available.

Advanced Materials 1994 vol. 6. No. 5, 379–81—Solar Cells with Improved Efficiency Based on Electrodeposited Copper Indium Diselenide Thin Films, Guillmoles et al. no month available.

Jpn. J. Appl. Phys. vol. 32 (1993) pp. 1562–1567 Part 1, No. 4, Apr. 1993—Preparation and Characterization of Electrodeposited CuInSe$_2$ Thin Films—Sudo et al. no month available.

Advanced Materials 1994 vol. 6, No. 5—pp. 376–379—Recrystallization of Electrodeposited Copper Indium Diselenide Thin Films in an Atmosphere of Elemental Selenium—Guillemoles et al. no month available.

J. Electrochemical Society, vol. 134, No. 7, Jul. 1987, pp. 1727–1729—Pulse Plated Electrodeposition of CuInSe$_2$ Films—C.D. Lokhande.

PREPARATION OF COPPER-INDIUM-GALLIUM-DISELENIDE PRECURSOR FILMS BY ELECTRODEPOSITION FOR FABRICATING HIGH EFFICIENCY SOLAR CELLS

RELATED APPLICATIONS

This application claims the benefit of provisional applications Ser. Nos. 60/044,506 filed Apr. 21, 1997 and 60/004,269 filed Sep. 25, 1995, and is a cip application of Ser. No. 08/571,150 filed Dec. 12, 1995, now U.S. Pat. No. 5,730,852.

The government has rights in this invention pursuant to National Renewable Energy Laboratory (NREL) contract No. 1326.

BACKGROUND OF THE INVENTION

1. Field of the Invention

The field of the present invention relates to the preparation of thin film semiconductor devices. More particularly, the present invention relates to electrodeposition of copper-indium-gallium-diselenide films for solar cells.

2. Description of the Related Art

Chalcopyrite ternary thin films of copper-indium-diselenide ($CuInSe_2$) and copper-indium-gallium-diselenide ($CuIn_{1-x}Ga_xSe_2$), both of which are generically referred to as $Cu(In,Ga)Se_2$, CIGS, or simply CIS, have become the subject of considerable interest and study for semiconductor devices in recent years. Sulphur can also be, and sometimes is, substituted for selenium, so the compound is sometimes also referred to even more generically as $Cu(In,Ga)(Se,S)_2$ so as to encompass all of these possible combinations. These devices are also referred to as $I–III–VI_2$ devices according to their constituent elemental groups.

These devices are of particular interest for photovoltaic device or solar cell absorber applications. For photovoltaic applications, the p-type CIGS layer is combined with an n-type CdS layer to form a p-n heterojunction CdS/CIGS device. The direct energy gap of CIGS results in a large optical absorption coefficient, which in turn permits the use of thin layers on the order of 1–2 $\mu$m. An additional advantage of CIGS devices is their long-term stability.

Various methods have been reported for fabricating CIGS thin films. Some of the earliest techniques involved heating copper and indium on a substrate in the presence of a selenium-containing gas, including $H_2Se$. The heating of copper and indium films in the presence of a selenium-containing gas is known as selenization. One drawback to selenizing with $H_2Se$ is that $H_2Se$ gas is highly toxic, thus presenting serious hazards to humans in large scale production environments.

In U.S. Pat. No. 5,045,409, Eberspacher et al. disclose depositing copper and indium films by magnetron sputtering, and depositing a selenium film by thermal evaporation, followed by heating in the presence of various gases. Other methods for producing CIS films have included Molecular Beam Epitaxy, electrodeposition either in single or multiple steps, and vapor deposition of single crystal and polycrystalline films.

Although vapor deposition techniques have been used to yield solar cells with efficiencies as high as seventeen percent (17%), vapor deposition is costly. Accordingly, solar cells made by vapor deposition have generally been limited to devices for laboratory experimentation, and are not suitable for large scale production. On the other hand, thin film solar cells made by electrodeposition techniques are generally much less expensive. However, solar cells produced by electrodeposition generally suffer from low efficiencies. For example, in *Solar Cells with Improved Efficiency Based on Electrodeposited Copper Indium Diselenide Thin Films*, ADVANCED MATERIALS, Vol. 6 No. 5 (1994), Guillemoles et al. report solar cells prepared by electrodeposition with efficiencies on the order of 5.6%.

SUMMARY OF THE INVENTION

Accordingly, it is a general object of this invention to provide an improved process for fabricating high quality thin film $Cu(In,Ga)Se_2$ solar cells.

It is also an object of this invention to provide low cost, high quality thin film solar cells having high conversion efficiencies.

It is a further object of this invention to provide a process for producing Cu—In, Cu—Se, Cu—In—Se, and Cu—In—Ga—Se thin films that have applications in solar and non-solar cells.

It is a still further object of this invention to provide a process for electrodepositing a gallium-containing thin-film solar cell precursor.

To achieve the foregoing and other objects and advantages in accordance with the purpose of the present invention, as embodied and broadly described herein, the process of this invention includes electrodepositing a layer of $Cu_xIn_yGa_zSe_n$ (x=0–2, y=0–2, z=0–2, n=0–3), preferably using direct current in combination with high frequency alternating current. Electrodeposition baths containing 0.1–0.2 molar (M) copper ions, 0.05–0.15M indium ions obtained from indium chloride, 0.05–0.15M gallium ions obtained from gallium chloride, 0.01–0.03M selenium ions, and at least 0.3M lithium chloride were found to produce simultaneous co-electrodeposition of copper, indium, selenium, and appreciable amounts of gallium with a good morphology, when an electrodeposition potential having a high frequency alternating current superimposed upon a DC current was applied. Following simultaneous co-electrodeposition, additional material was vapor deposited to adjust the final composition of the deposited film very close to stoichiometric $Cu(In_{1-x}Ga_x)Se_2$.

This unique two-step film deposition process allows precursor metal films to be deposited by inexpensive electrodeposition, and then adjusted using the more expensive but more precise technique of physical vapor deposition (PVD) to bring the final film into the desired stoichiometric range. Solar cells may then be completed as for example by chemical bath deposition (CBD) of CdS followed by sputtering of ZnO, and addition of bi-layer metal contacts as well as optional anti-reflective coating.

A solar cell made according to the process disclosed herein achieved a device conversion efficiency of 13.6%. This represents a significant improvement over the 9.4% conversion efficiency device disclosed in U.S. patent application Ser. No. 08/571,150, filed Dec. 12, 1995 now U.S. Pat. No. 5,730,882, of which this application is a continuation-in-part.

The present invention also includes electrodeposition solutions and process parameters whereby gallium may be co-electrodeposited in appreciable amounts along with copper, indium, and selenium, while still obtaining a densely packed, uniform morphology film suitable for processing into a photovoltaic cell. This co-electrodeposition of gallium further decreases the amount of stoichiometry adjustment that must be made by the later PVD step.

Additional objects, advantages, and novel features of the present invention will be set forth in part in the description that follows, and in part will become apparent to those skilled in the art upon examination of the following description and drawings.

DETAILED DESCRIPTION OF THE PREFERRED EMBODIMENTS

The present invention includes an essentially two-step process for fabricating high quality, low cost thin film CIGS semiconductor devices that exhibit photovoltaic characteristics and are especially adaptable for solar cell applications. In the first step, a precursor film of $Cu_xIn_yGa_2Se_n$ (x=0–2, y=0–2, z=0–2, n=0–3) is electrodeposited on a substrate such as glass coated with molybdenum. This first step may include a unique process and electrodeposition bath for electrodepositing gallium concurrently with other elements, as well as the unique use of an alternating current in conjunction with a direct current.

The second step is physical vapor deposition of copper, indium, gallium, and/or selenium. In this second step the composition of the overall film is carefully controlled so that the resulting thin film is very close to stoichiometric $Cu(In_{1-x}Ga_x)Se_2$. Both of these steps may be performed on substrates having large surface areas. Accordingly, the process of the present invention allows large area, high efficiency solar cells to be economically produced.

Figure 1:
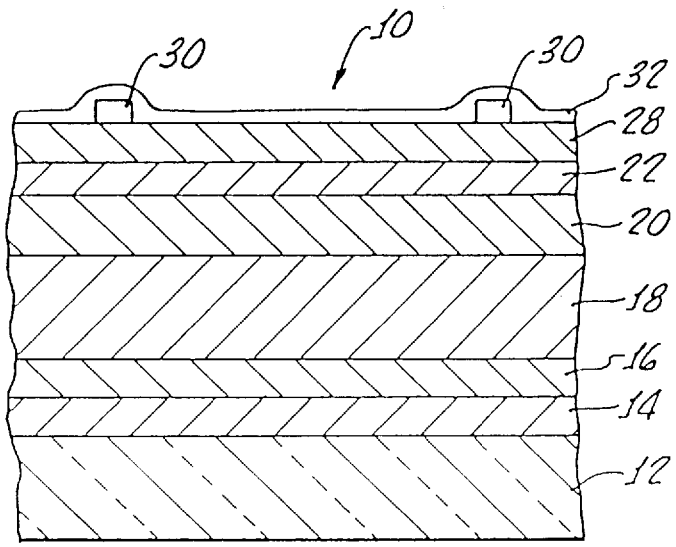
FIG. 1 is a cross sectional view of a CIGS photovoltaic device prepared according to the present invention.

Referring now to FIG. 1, CdS/CIGS photovoltaic device 10 includes a substrate 12 which may be, for example, soda-lime silica glass or amorphous 7059 glass. Substrate 12 further includes a back contact layer 14 of molybdenum, about 1–2 μm thick. The molybdenum may be deposited using DC sputtering from a rotating cylindrical magnetron target (CMAG). To improve adhesion between the Mo layer 14 and the precursor film to be deposited, an additional adhesion layer 16 of copper may also be deposited as by electrodeposition. After Mo layer 14 and optional copper adhesion layer 16 have been deposited, the substrate should be degreased as for example with propanol and dried in flowing nitrogen gas.

A metallic precursor film 18 is then deposited by electrodeposition. The precursor film contains one or more of the elements copper, indium, gallium, and selenium. Electrodeposition is generally a less expensive method of depositing these metals than vapor deposition. However, it is not possible to control the ratios of metals deposited during electrodeposition as precisely as desired. Consequently, prior CIS layers deposited entirely by electrodeposition produced low conversion efficiencies. In the present invention, the electrodeposition step is integrated with the vapor deposition step that follows. This allows precursor metal to be deposited in bulk using an economical electrodeposition step, followed by a vapor deposition step to carefully control the final metal ratios. This results in economical production yet high efficiencies of the resulting cell. The composition of metal precursor film 18 is generally denoted as $Cu_xIn_yGa_2Se_n$ (x=0–2, y=0–2, z=0–2, n=0–3). The metal precursor film 18 should be deposited to about 1–3 μm thick, with thickness being controlled by coulometric measurements.

It has been found that electrodepositing the films using an AC voltage in addition to a DC voltage produces improved results. An AC voltage improves the morphology of the film. It is also believed that the AC voltage improves nucleation (growth) of the thin film by allowing additional nucleation centers to be created. For an entirely aqueous plating solution, the applicable DC voltage range is approximately 1–5 VDC, with a preferred voltage of approximately 3 VDC. Improved results may be obtained by superimposing an AC voltage of 0.2–5.0 VAC at 1–100 Khz, with preferred values of approximately 3.5 VAC at 10–30 KHz. The plating solution is adjusted to have a pH of approximately 1.0 to 4.0, and more preferably to about 1.4 to 2.4. The plating solution should preferably be at about 10° C. to 80° C., and more preferably at about 24° C. Adding a supporting electrolyte to the plating bath can additionally increase the conductivity of the plating solution, allowing for a further increase in the electrodeposition rate. Salts such as NaCl, LiCl, or $Na_2SO_4$ have been found to be suitable supporting electrolytes for use with certain embodiments of the present invention.

In completely aqueous solutions, electrolysis of water molecules begins to occur to an undesirable extent at voltage levels that are too high. The resulting $O^{2-}$ and $OH^-$ ions combine with deposition metal ions or deposited metal to form unwanted metal oxides and hydroxides on the precursor film 18. To overcome this disadvantage, the water in the plating solution may be either partially or completely replaced by one or more organic solvents such as dimethyl sulfoxide (DMSO). Increasing the organic solvent content of the electrodeposition solution allows the cathodic potential to be increased without unacceptable increases in metal oxide and hydroxide formation rates. The increased cathodic potential increases the deposition rate of the precursor films. An additional advantage is that increasing the cathodic potential increases the deposition rate of gallium relative to the deposition rates of other deposited metals. Therefore, using a solution containing one or more organic solvents allows the cathodic potential to be selected from a wider range so as to achieve a more desired stoichiometry of the as-deposited precursor film 18. When an organic solvent is used, the preferred cathodic potential is approximately 3–10 VDC and 0.2–5.0 VAC at approximately 1–100 KHz. Value of approximately 5 VDC and 0.45 VAC at approximately 18.1 KHz were found to yield good results.

As the number of elements to be simultaneously electrodeposited increases, the difficulties increase. Obtaining simultaneous electrodeposition of four elements in predefined ratios with good morphology, for example, can be an extremely difficult task. The parameters that must be simultaneously adjusted include but are not limited to: total solution molarity, relative molarities of constituents, from which compounds to obtain the desired constituent elements, pH, temperature, voltage, waveform characteristics, and electrolytic fluid. Because of the complexities involved in simultaneous co-electrodeposition, it is believed that gallium had never before been successfully co-electrodeposited along with copper, indium, and selenium to produce a photovoltaic device. The present invention includes solutions and process parameters whereby gallium may be co-electrodeposited in appreciable amounts along with the other three constituent elements of CIGS.

If desired, a second electroplating solution may be employed to adjust the stoichiometry of the electrodeposited film prior to the vapor deposition phase. For example, a first electrodeposition step may produce a CIGS precursor film with less gallium than optimally desired. Although the gallium content can be increased during the vapor deposition phase, it may be less expensive to deposit a certain amount of gallium using a second electrodeposition solution to make a coarse stoichiometric adjustment prior to proceeding to fine stoichiometric adjustment at the vapor deposition step. Another potential motivation for using a second electrodeposition solution is to achieve a composition gradient in the deposited film, as suggested by U.S. Pat. No. 4,335,266 issued to Michelsen et al. which is hereby incorporated by reference for its teachings of composition-graded CIGS thin films for solar cell and other applications. Yet another way of achieving composition grading during electrodeposition is to vary process parameters such as cathodic potential, ionic concentrations, pH, or temperature, as electrodeposition proceeds.

Several examples of electrodeposited precursor films fabricated according to the present invention are given. These examples include Cu—In—Ga—Se, In—Se, Cu—Se, and Cu—In—Se, precursor films. The solution for co-depositing all four elements includes ions of each of the elements of copper, indium, gallium, and selenium. The metal ions may be supplied in the form of dissolved metal salts. For precursor films that do not contain gallium, gallium should be added to raise the energy gap.

In the discussion and claims that follow, electrodeposition potential is expressed in terms of a voltage without specifying positive or negative voltage.

It is to be understood that the substrate or working electrode on which the thin film is to be deposited is to be connected as the electrodeposition cathode, with the counter electrode being connected as the anode. Accordingly, the electrodeposition voltages discussed herein are to be understood as negative voltages. In accordance with this convention, where electrodeposition voltages are expressed as, e.g., "at least 1.0 volt", this indicates that an electrodeposition voltage that is at least as negative as −1.0 volt with respect to the counter electrode is to be applied to the substrate. Discussing the electrodeposition voltages as unsigned voltages is to be understood as merely a shorthand way of referring to the absolute potential difference between the electrodes.

After the precursor film 18 has been electrodeposited it should be cleaned. A suitable method is to rinse precursor film 18 with deionized water and dry it in flowing nitrogen gas. After precursor film 18 has been cleaned, an additional layer 20 of copper, indium, gallium, and/or selenium, is deposited by physical vapor deposition to adjust the final film composition to the ratios of approximately Cu=1–1.2: (In, Ga)=1–1.2: Se=2–2.5, and most preferably to approximately 1:1:2. That is, the final film composition is adjusted to approximately $Cu_1(In,Ga)_1Se_2$, which is to say $Cu_1(In_{1-x}Ga_x)Se_2$ where x is within the range of 0 to 1, inclusive. By controlling the ratio of In/Ga the energy gap between the CdS and the CIGS layers can be adjusted to the optimal or nearly optimal value. An energy gap of approximately 1.45 eV is considered optimal for terrestrial solar energy conversion, and is achieved by an In/Ga ratio of approximately 3:1. For cells prepared according to the method disclosed herein, a Ga/(In+Ga) atomic ratio of 0.34–0.50 is preferred, with a ratio of 0.39 producing the highest observed efficiency. The substrate (precursor film) temperature should be 300° C. to 600° C. during PVD, and preferably about 550° C.

After PVD, the films should then be annealed. Annealing improves the homogeneity and quality of the films. A high quality CIGS film is one that does not exhibit an excessive amount of copper nodules, voids, or vacancies in the film which would reduce conversion efficiencies. Annealing the films at 250° C. to 500° C. in a vacuum, followed by slow cooling at a rate of approximately 3° C./min to avoid thermal shock was found to yield good results. Because selenium has a much higher vapor pressure than either copper, indium, or gallium, selenium may be lost from the film during the high temperature steps of vapor deposition and annealing. To compensate, the atmosphere during these steps may contain a moderate overpressure of selenium. In the preferred embodiment, the film is selenized at a rate of 5–100 Å/s during cool-down from PVD temperature to annealing temperature.

Once the CIGS layers 18 and 20 collectively are deposited and annealed, a thin layer 22 of n-type semiconductor comprising cadmium sulfide is deposited next. CdS layer 22 is preferably deposited by chemical bath deposition (CBD) to a thickness of approximately 200–1000 Å. The CBD bath may be prepared from 0.08 gm $CdSO_4$, 2.5 gm thiourea, and 27.5 gm $NH_4OH$ dissolved in 200 ml water. The deposition temperature should be approximately 40°–80° C.

Figure 2:
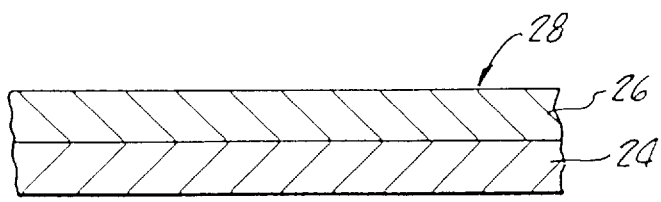
FIG. 2 is a cross sectional view of the conducting zinc oxide layer 28 shown in FIG. 1.

A layer 28 of conducting wide bandgap n-type semiconductor materials is deposited next. In the preferred embodiment, layer 28 comprises two zinc oxide layers 24 and 26 as shown in FIG. 2. First zinc oxide layer 24 is deposited with RF sputtering at approximately 0.62 watts/$cm^2$ in an argon plasma at 10 millitorrs pressure. Second zinc oxide layer 26, comprising approximately 1–5% $Al_2O_3$-doped zinc oxide, is also prepared using RF sputtering at approximately 1.45 watts/$cm^2$ in an argon plasma at 10 millitorrs pressure. In an exemplary embodiment the resistivity of the first layer was 50–200 ohm/$cm^2$, and resistivity of the second layer was 15–20 ohm/$cm^2$. The transmissivity of the overall ZnO layer was 80–85%.

Bi-layer metal contacts 30 may then be prepared with an e-beam system or other techniques. In an exemplary embodiment a first metal contact layer was 500–1000 Å thick Ni and the second metal contact layer was 1–3 $\mu$m thick Al. Metal contacts 30 will generally be laid out in fine grid lines across the collecting surface of the device and connected to a suitable current collecting electrode (not shown). The efficiency of the resulting device can be further increased by adding an antireflection coating 32, such as a 600–1000 Å layer of $MgF_2$ by electron beam. A device prepared according to Example 3 below exhibited a conversion efficiency of 13.6%.

EXAMPLE 1

A thin film containing copper, indium, gallium, and selenium was deposited onto a glass substrate coated with approximately 500 Å Mo, and processed into a photovoltaic cell. The thin film was obtained by preparing a solution containing ions of copper, indium, and selenium, and further including ions of gallium in a concentration of at least 0.05 molar, and at least 0.3 molar LiCl. More particularly, the electrodeposition bath comprised 2.1286 gm $Cu(NO_3)_2 \cdot H_2O$, 7.9625 gm $InCl_3$, 1.3929 gm $H_2SeO_3$, and 9.2063 gm $Ga(NO_3)_3$, and 14.08 gm LiCl dissolved in 450 ml of water. The resulting bath comprised approximately 0.014M copper, 0.08M indium, 0.08M gallium, and 0.023M selenium ions. The pH was adjusted to 1–2. Deposition proceeded at 24° C.

Figure 3:
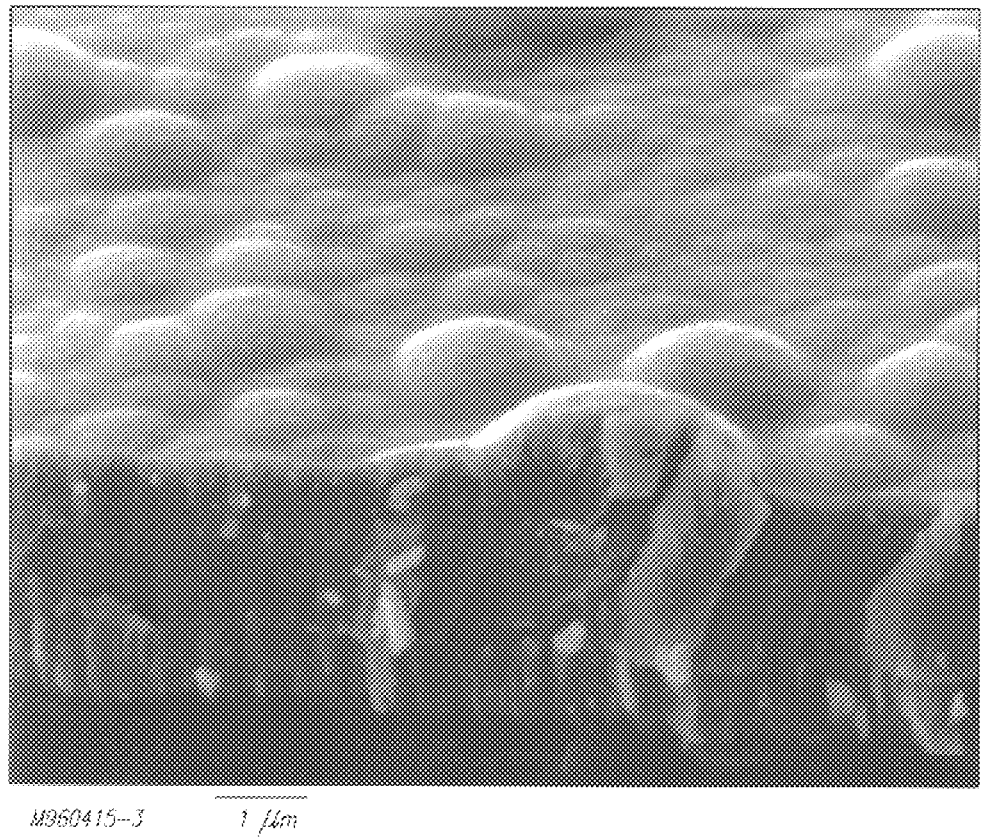
FIG. 3 is a scanning electron miscroscope photograph of the electrodeposited precursor film of Example 1 of the present invention.

The substrate was employed as the working electrode, and platinum gauze was used as the counter electrode in a two electrode system. The electrodeposition voltage comprised a DC component of at least 0.5 volt. More particularly, the electrodeposition voltage comprised a DC voltage of at least 1.0 volt and an AC voltage of at least 0.5 V at a frequency of at least 1.0 KHz superimposed thereon. Still more particularly, the electrodeposition voltage comprised a DC component of 3.0 volts, and an AC component of 3.5 volts pulsed at 20 KHz superimposed thereon. The voltage was supplied by a power source obtained from Team Specialty Products Corporation of Albuquerque, N.M. The AC component is nominally a square wave. However, due to the complex impedances of the power supply and the remainder of the electrodeposition equipment operating at 20 KHz, it will be understood that the voltage as measured at the substrate will not be a perfect square wave. Thus, the applied voltage is more properly described using the broader term of AC "pulsed" rather than the narrow term of a "square wave". This convention will be maintained throughout this disclosure and appended claims. The resulting as-deposited precursor layer had a composition of $Cu_{1.00}In_{0.34}Ga_{0.02}Se_{0.91}$. FIG. 3 is a scanning electron miscroscope photograph of the as-deposited film. The photograph shows the film to be tight, densely packed, and uniform.

After electrodeposition, additional In, Cu, Ga, and/or Se were added to the film by physical evaporation to adjust the final composition to $CuIn_{1-x}Ga_xSe_2$, with the ratio of Ga/(In+Ga) being 0.16. The films were allowed to crystallize at 550° C. for five minutes. The substrate (precursor film) temperature during the physical evaporation step was also 550° C. The film was then selenized by exposure to selenium vapor during the cool-down time, with cooling at approximately 20° C. per minute.

Figure 7:
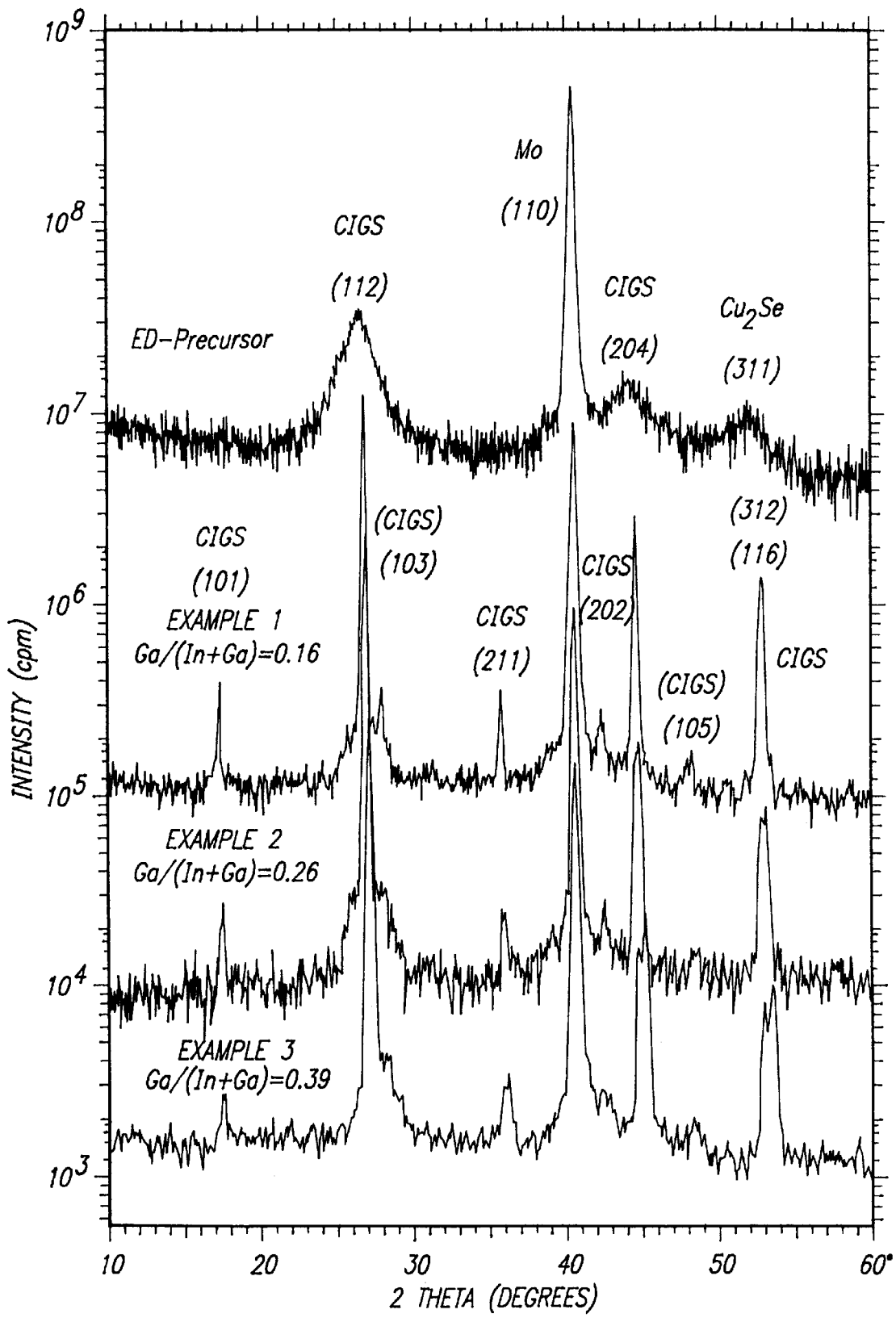
FIG. 7 is the x-ray analysis results for the electrodeposited film, and the finished films of Examples 1–3.

FIG. 7 is the X-ray analysis results for the electrodeposited film, and the finished films of Examples 1–3. The X-ray analysis of the as-deposited precursor film indicates the presence of both the CIGS phase and the $Cu_2Se$ phase. The X-ray analysis of the film after final film composition adjustment shows only the CIGS phase. The shifts in 2-theta values are due to different Ga concentrations in the absorber layers.

Photovoltaic devices were completed by chemical bath deposition of approximately 500 Å CdS followed by radio frequency sputtering of 500 Å intrinsic ZnO and 3500 Å of $Al_2O_3$-doped ZnO. Bilayer Ni/Al top contacts were deposited using an e-beam system. An anti-reflection coating of 100 nm of $MgF_2$ was applied as the final step.

Figure 4:
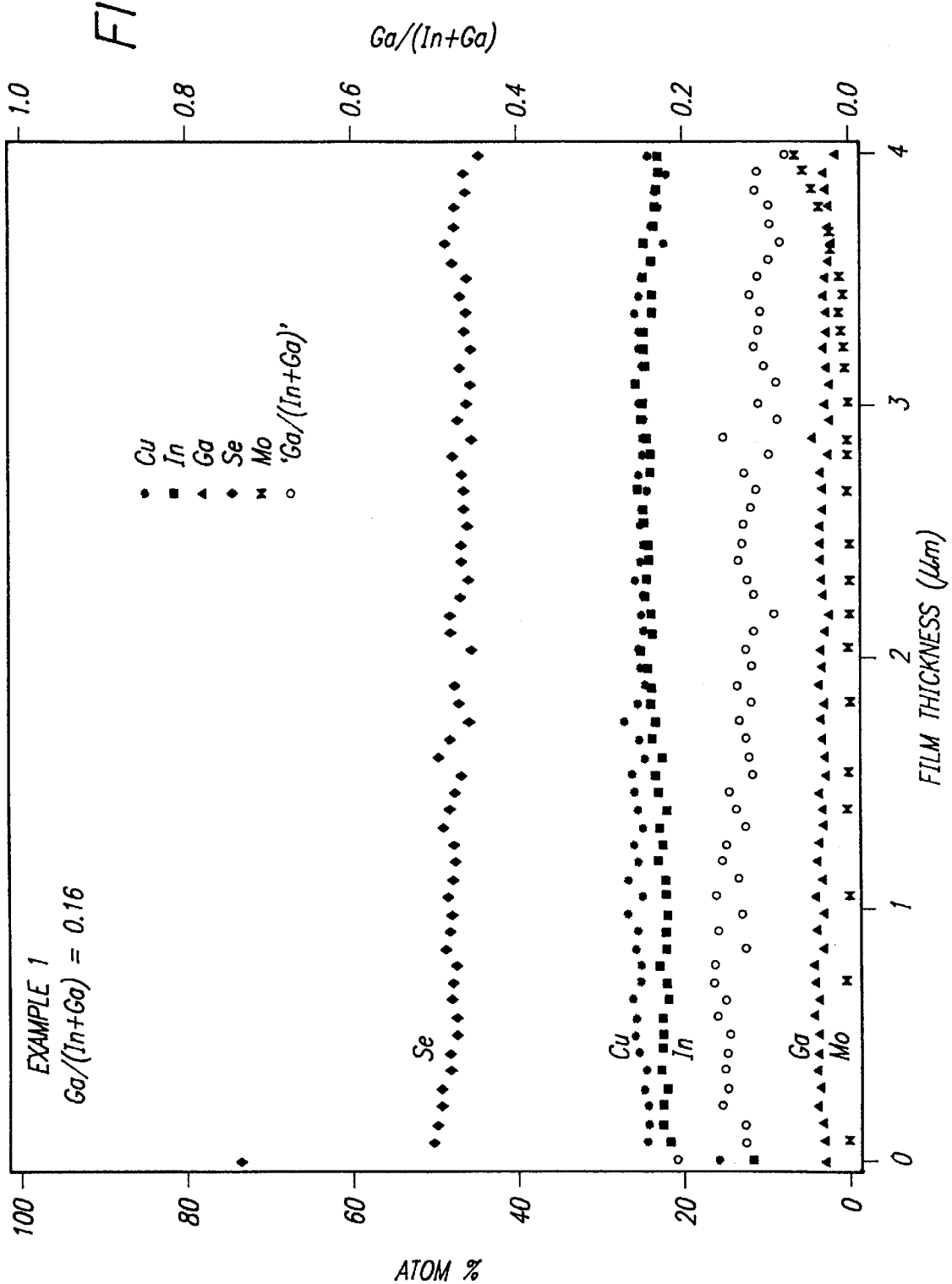
FIG. 4 is a graph of the Auger electron spectroscopy analysis for the cell of Example 1.
Figure 8:
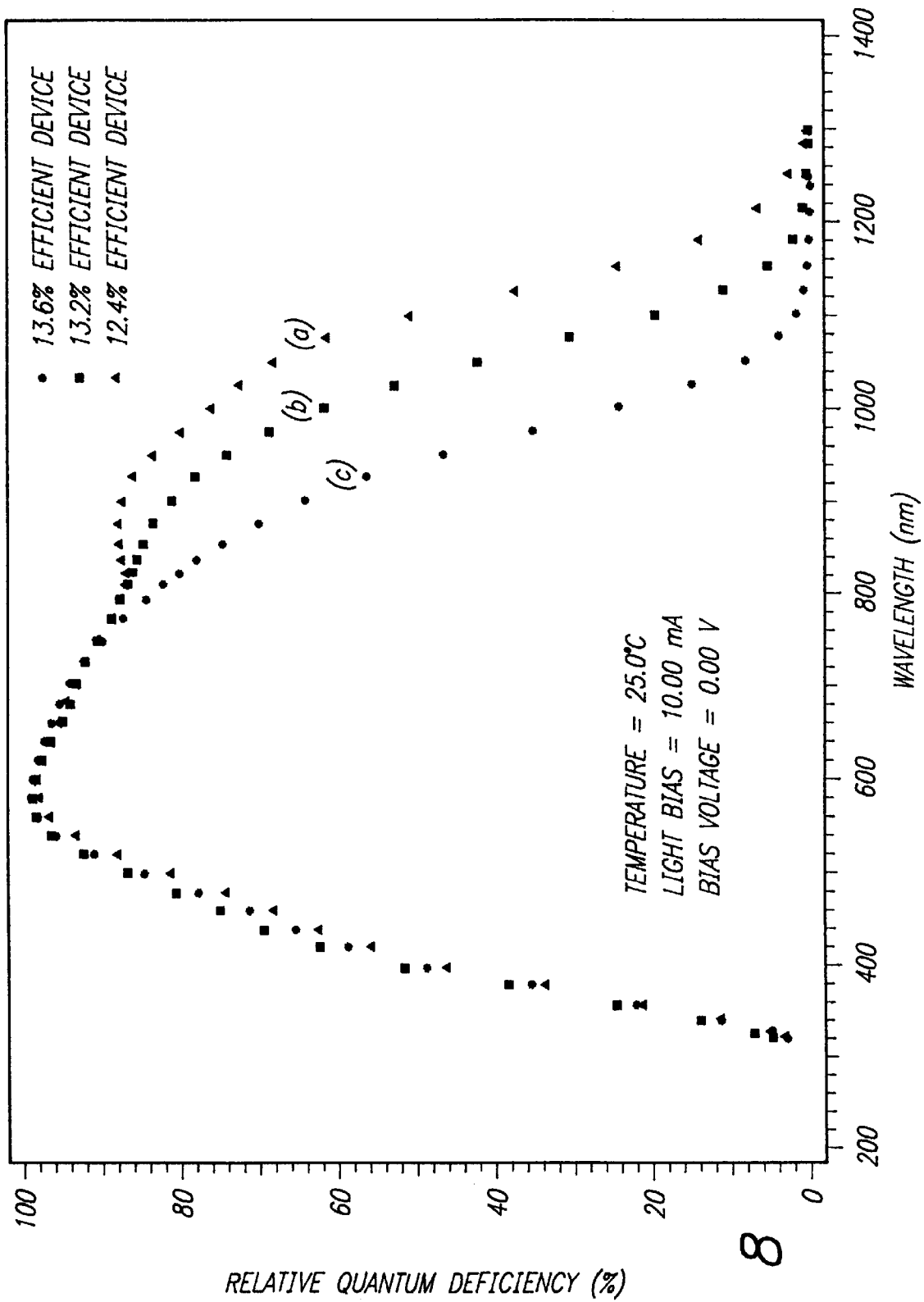
FIG. 8 is a graph of the relative quantum efficiency verses wavelength for the cells of Examples 1–3.
Figure 9:
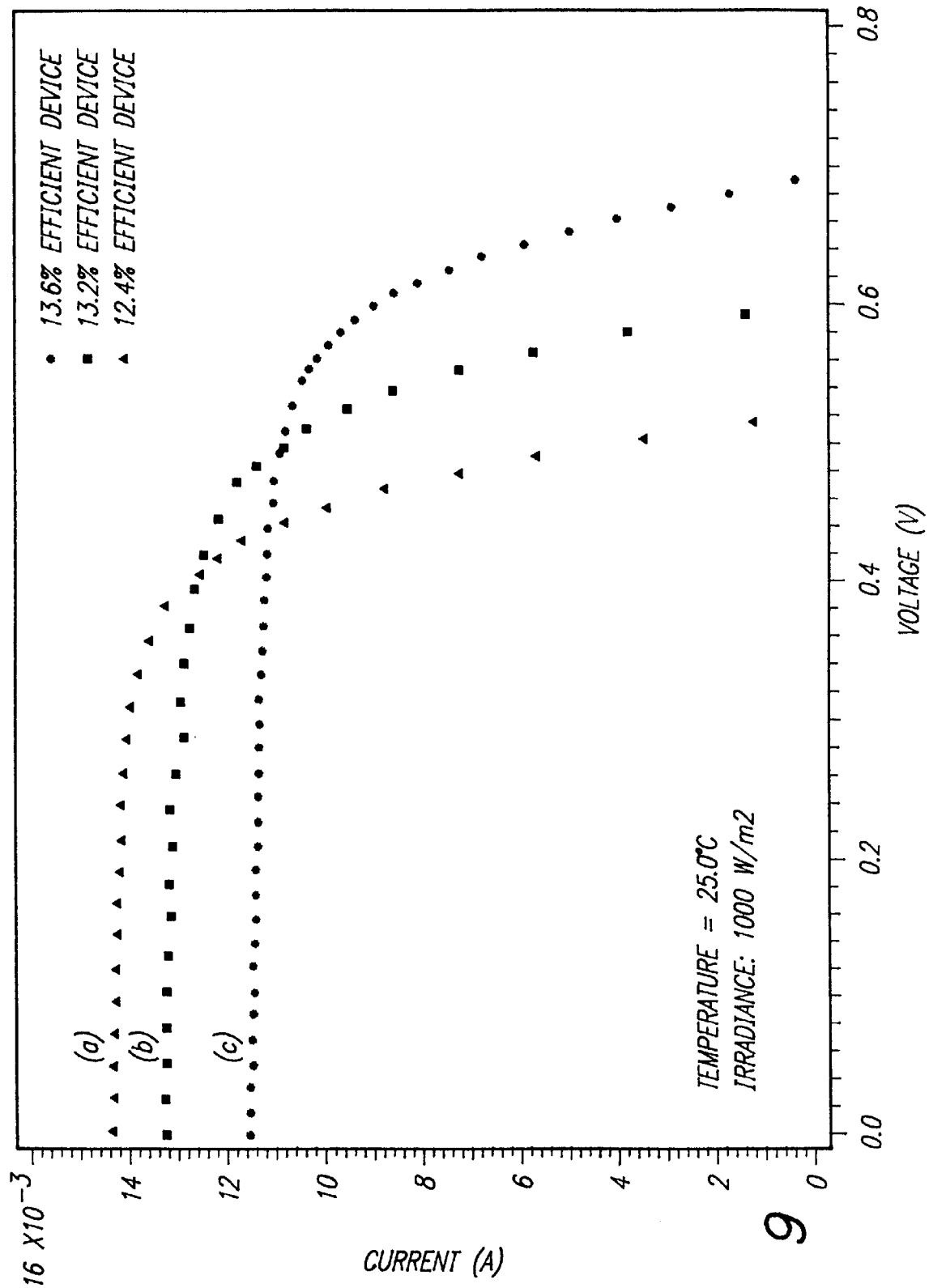
FIG. 9 is a graph showing the Current versus Voltage characteristics of the cells of Examples 1–3.

The device was evaluated at AM1.5 illumination (1000 $W/m^2$, 25° C., ASTM E892 global). The device was also characterized by Auger electron spectroscopy (AES). FIG. 4 is the AES analysis results for the finished photovoltaic cell showing the atomic distribution of the film at varying depths within the film. FIG. 8 shows the relative quantum efficiency of the cell as a function of wavelength. FIG. 9 shows the Current versus Voltage characteristics of the finished cell. The cell exhibited an overall efficiency of 12.4%. Other performance parameters for this cell are listed in Table 1 below.

EXAMPLE 2

Figure 5:
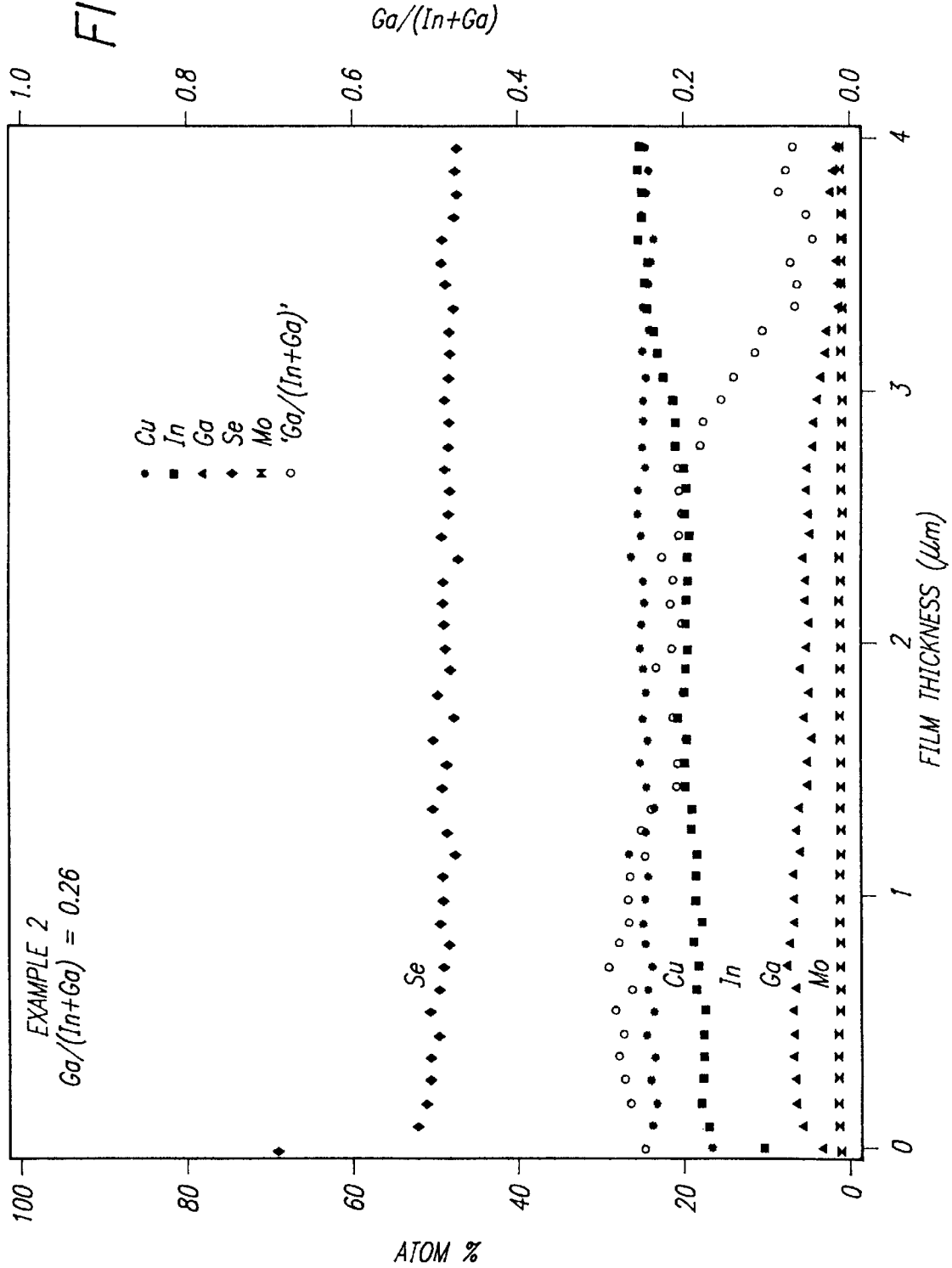
FIG. 5 is a graph of the Auger electron spectroscopy analysis for the cell of Example 2.

A cell was prepared according to Example 1, but the PVD step was conducted to adjust the final Ga/(In+Ga) ratio to 0.26 rather than 0.16. The device efficiency improved from 12.4% to 13.2%. The AES analysis is shown in FIG. 5. The relative quantum efficiency is shown in FIG. 8. The Current vs. Voltage performance is shown in FIG. 9.

EXAMPLE 3

Figure 6:
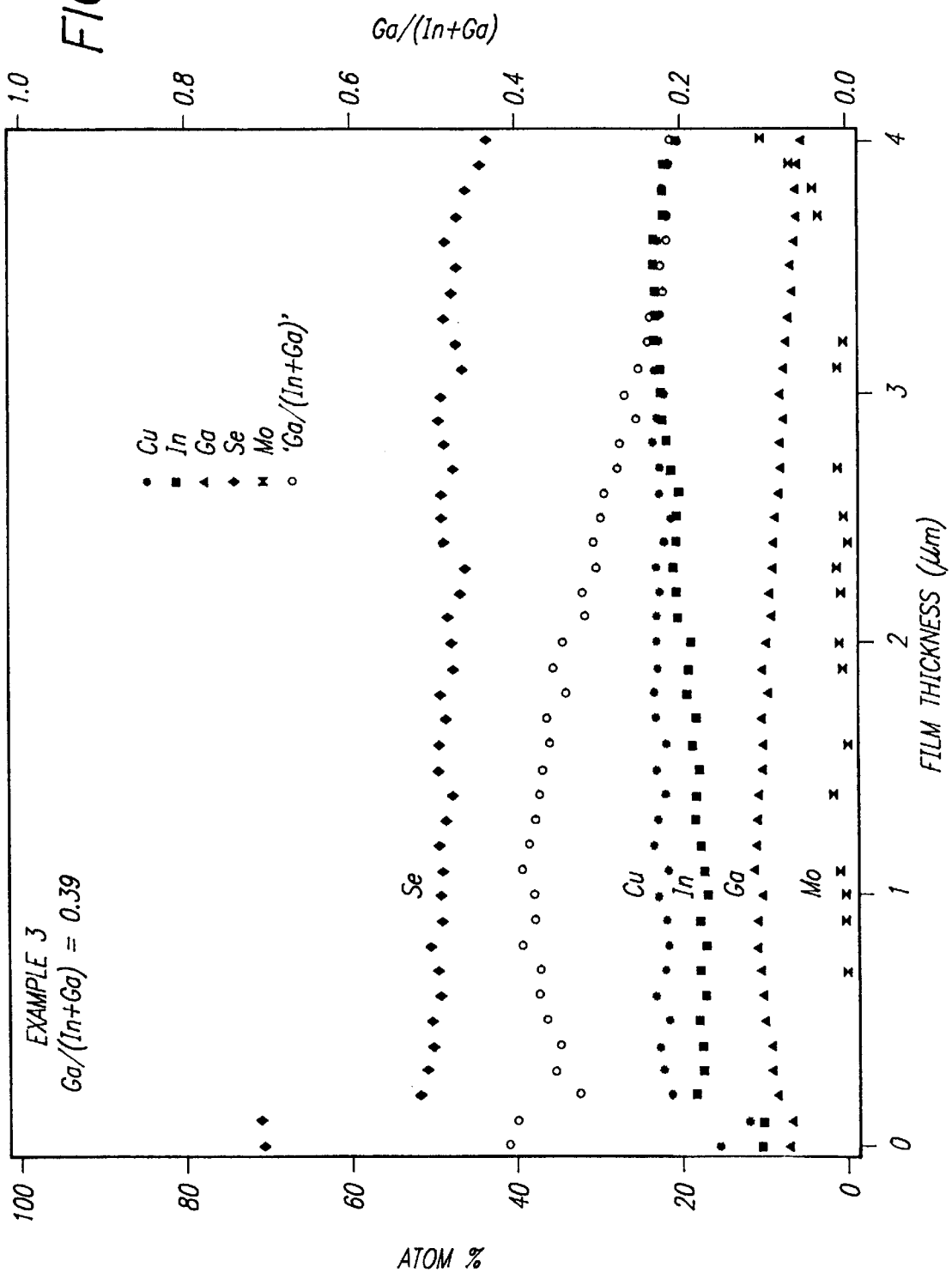
FIG. 6 is a graph of the Auger electron spectroscopy analysis for the cell of Example 3.

A cell was prepared according to Example 1, but the PVD step was conducted to adjust the final Ga/(In+Ga) ratio to 0.39. The overall device efficiency improved to 13.6%. The AES analysis is shown in FIG. 6. The relative quantum efficiency is shown in FIG. 8. The Current vs. Voltage performance is shown in FIG. 9. Performance parameters for the cells of Examples 1–3 are given in Table 1 below.

TABLE 1

| Example | Ga/(In + Ga) | Area (cm²) | $V_{OC}$ (mV) | $J_{SC}$ (mA/cm²) | Fill Factor (%) | Total-Area Efficiency |
|---|---|---|---|---|---|---|
| 1 | 0.16 | 0.413 | 521 | 34.9 | 68.2 | 12.4 |
| 2 | 0.26 | 0.420 | 602 | 31.7 | 69.4 | 13.2 |
| 3 | 0.39 | 0.419 | 689 | 27.6 | 71.6 | 13.6 |

Performance Parameters for Photovoltaic Cells of Examples 1–3

EXAMPLE 4

A bath containing approximately 0.016M $Cu(NO_3)_2 \cdot H_2O_3$, 0.08M $InCl_3$, 0.08M $H_2SeO_3$, and 0.024M $Ga(NO_3)_3$ (relative ratios of approximately 1, 5, 5, and 1.5, respectively) was prepared at a pH of 1.6. Electrodeposition proceeded at at least 2.0 volts DC and at least 2.0 volts AC at a frequency of at least 10 KHz superimposed thereon. More particularly, electrodeposition proceeded at 3.0 VDC with a pulsed AC voltage of 3.5 volts at a frequency of 20 KHz superimposed thereon. ICP compositional analysis revealed the following film compositions before and after the precursor film was finished:

As-Deposited: $Cu_{1.00}In_{0.36}Ga_{0.03}Se_{1.00}$

After PVD adjustment: $Cu_{1.00}In_{1.04}Ga_{0.18}Se_{2.22}$

Note that the as-deposited film contains the highest gallium content of any of the examples presented herein.

A photovoltaic device was completed as before, with the final Ga/(In+Ga) ratio adjusted to approximately 0.3. The final efficiency of the device was 12.3%.

EXAMPLE 5

An electrodeposition bath was prepared by dissolving 1.9956 gm $Cu(NO_3)_2 \cdot H_2O$, 9.9531 gm $InCl_3$, 1.7411 gm $H_2SeO_3$, and 12.0832 gm $Ga(NO_3)_3$, and 15 gm LiCl in 450 ml of water (0.18M copper ions, 0.10 indium ions, 0.105M gallium ions, and 0.29M selenium ions). Electrodeposition proceeded at a voltage of 3.00 VDC and 3.53 VAC superimposed thereon. The composition of the as-deposited precursor layer, expressed as $10^{16}$ atoms/cm², was $Cu_{1.00}In_{0.46}Ga_{0.01}Se_{1.16}$. The precursor layer was completed by PVD. The finished device exhibited a conversion efficiency of 12.3%.

EXAMPLE 6

A metallic precursor film of $In_{1-2}Se_{1-3}$ was electrodeposited on glass substrates coated with a Mo or Mo/Cu layer approximately 500 Å thick. The precursor film was deposited using an electroplating solution containing 2.25 gm $InCl_3$ and 0.41 gm $H_2SeO_3$ dissolved in 200 ml of water. The pH of the solution was adjusted between 1.4 and 2.4 using dilute HCl (10% by volume). The films were deposited by applying a 2–5 V direct current voltage in combination with an alternating current voltage of 0.45 V at 18.1 KHz frequency. The films were 1–3 µm thick and adhered to the substrate.

EXAMPLE 7

A metallic precursor film of $Cu_{1-2}Se_{1-3}$ was electrodeposited on a substrate using an electroplating solution containing 6.21 gm $Cu(NO_3)_2 \cdot 6H_2O$ and 1.16 gm $H_2SeO_3$ dissolved in 300 ml water. The pH was adjusted between 1.4 and 2.4 using dilute HCl (10% by volume). The films were deposited by applying a 2–5 V direct current voltage in combination with an alternating current voltage of 0.45 V at 18.1 KHz frequency. As deposited layers were 1–3 µm thick and adhered to the substrate.

EXAMPLE 8

A metallic precursor film of $Cu_{1-2}In_{1-2}Se_{1-3}$ was electrodeposited on a substrate using an electroplating solution containing 4.47 gm $CuCl_2$, 5.67 gm $InCl_3$ and 3.39 gm $H_2SeSO_3$ dissolved in 1050 ml water. The pH was adjusted between 1.4 and 2.4 using dilute HCl (10% by volume). The films were deposited by applying a 2–5 V direct current voltage in combination with an alternating current voltage of 0.45 V at 18.1 KHz frequency. As deposited layers were 1–3 µm thick and adhered to the substrate. The electrodeposited film was slightly indium poor. Indium was then added by vapor deposition to adjust the final content to approximately $CuInSe_2$. CdS and ZnO were then added to complete the solar cell. The resulting solar cell was exposed to ASTM E892-87 Global (1000 $Wm^{-2}$) standard irradiance spectrum at 25° C. Performance parameters for the finished solar cell, having an area of 0.4285 $cm^2$, were measured as:

| | |
|---|---|
| $V_{OC}$ = 0.4138 V | $V_{Pmax}$ = 0.3121 V |
| $I_{SC}$ = 15.40 mA | $I_{Pmax}$ = 12.96 mA |
| $J_{SC}$ = 35.94 mA $cm^{-2}$ | $P_{max}$ = 4.045 mW |
| Fill Factor = 63.47% | Efficiency = 9.44% |

The device contained only Cu—In—Se, without any gallium. The device exhibited an efficiency of 8.76% without antireflective coating, and 9.44% after an antireflective coating was added.

EXAMPLE 9

A precursor film of $Cu_{1-2}In_{1-2}Ga_{0.01-1}Se_{1-3}$ was electrodeposited using a solution containing 1.12 gm $Cu(NO_3)_2 \cdot 6H_2O$, 12.0 gm $InCl_3$, 4.60 gm $Ga(NO_3)_3 \cdot xH_2O$ and 1.80 gm $H_2SeO_3$ dissolved in 450 ml of water. This is equivalent to approximately 2.49 gm/l $Cu(NO_3)_2 \cdot 6H_2O$, 26.7 gm/l $InCl_3$, 10.2 gm/l $Ga(NO_3)_3 \cdot xH_2O$ and 4.0 gm/l $H_2SeO_3$, and approximately 0.0084, 0.12, 0.28, and 0.31 molar of copper, indium, gallium, and selenium ions, respectively. The pH was adjusted between 1.4 and 2.4 using dilute HCl (10% by volume). The films were deposited by applying a 2–5 V direct current voltage in combination with an alternating current voltage of 0.45 V at 18.1 KHz frequency. As deposited layers were 1–3 µm thick and adhered to the substrate.

EXAMPLE 10

A precursor film of $Cu_{1-2}In_{1-2}Ga_{0.01-1}Se_{1-3}$ was electrodeposited using a solution containing 1.496 gm $Cu(NO_3) \cdot 5H_2O$, 14.929 gm $InCl_3$, 1.523 gm $H_2SeO_3$, and 7.192 gm $Ga(NO_3)_3$ dissolved in 450 ml of DMSO. The films were deposited at 25° C. and also at 50° C. at an applied voltage of 5 VDC.

EXAMPLE 11

A precursor film of $Cu_{1-2}In_{1-2}Ga_{0.01-1}Se_{1-3}$ was electrodeposited using a solution containing 1.496 gm $Cu(NO_3) \cdot 5H_2O$, 14.929 gm $InCl_3$, 1.523 gm $H_2SeO_3$, and 7.192 gm $Ga(NO_3)_3$ dissolved in a mixture of 400 ml DMSO and 50 ml water. The films were deposited at 25° C. and also at 50° C. at an applied voltage of 5 VDC.

EXAMPLE 12

A precursor film of $Cu_{1-2}In_{1-2}Ga_{0.01-1}Se_{1-3}$ was electrodeposited using a solution containing 1.496 gm $Cu(NO_3) \cdot 5H_2O$, 14.929 gm $InCl_3$, 1.523 gm $H_2SeO_3$, 7.192 gm $Ga(NO_3)_3$, and 10 gm $Na_2SO_4$, and 20 gm LiCl dissolved in a mixture of 400 ml DMSO and 50 ml water. The films were deposited at 25° C. and also at 50° C. at an applied voltage of 5 VDC.

The present invention as described above may be incorporated in a variety of applications, as for example the conversion of solar energy to electric energy for baseline power generation. Other applications include appliances such as solar-powered calculators, battery charges such as those used with freeway emergency call boxes, photoelectric eyes, night security light activators, light meters for photographic and other purposes, and the like.

Although the present invention has thus been described in detail with regard to the preferred embodiments and drawings and examples thereof, it should be apparent to those skilled in the art that various adaptations and modifications of the present invention may be accomplished without departing from the spirit and the scope of the invention. Accordingly, it is to be understood that the detailed description and the accompanying drawings as set forth hereinabove are not intended to limit the breadth of the present invention, which should be inferred only from the following claims and their appropriately construed legal equivalents.

What is claimed is:

1. A process for preparing a copper-indium-gallium-diselenide film, the process comprising the steps of:
   providing a substrate;
   providing an electrodeposition bath containing ions of copper, indium, and selenium, the bath further containing ions of gallium in a concentration of at least 0.05 molar;
   inserting said substrate into said electrodeposition bath;
   forming a semiconductor layer by simultaneously electrodepositing a film comprising copper, indium, selenium and gallium from said electrodeposition bath onto said substrate, the electrodeposition proceeding at an applied electrodeposition voltage of at least 0.5 volt; and
   depositing by physical vapor deposition additional material selected from the group consisting of copper, indium, gallium, and selenium, onto said semiconductor layer to achieve a final stoichiometry for said semiconductor layer and said additional material, combined, of approximately $Cu_1(In_{1-x}Ga_x)Se_2$ where x is within the range of 0 to 1, inclusive.

2. The process of claim 1 wherein x is greater than approximately 0.34.

3. The process of claim 1 wherein said gallium ions are obtained from gallium nitrate.

4. The process of claim 3 wherein said electrodeposition bath further comprises at least 0.3 molar lithium chloride.

5. The process of claim 1 wherein:
said indium ions are obtained from indium chloride.

6. The process of claim 1 wherein:
said electrodeposition voltage comprises a DC voltage of at least 1.0 volt and an AC voltage of at least 0.5 V at a frequency of at least 1.0 KHz superimposed thereon.

7. The process of claim 6 wherein:
said AC voltage consists of a pulsed voltage.

8. The process of claim 7 wherein said AC voltage frequency is at least 10 KHz.

9. The process of claim 8 wherein said DC voltage is at least 2 volts, and said AC voltage is at least 2 volts.

10. A process for preparing a photovoltaic device gallium-containing precursor film, the process comprising the steps of:

providing a substrate;

providing an electrodeposition bath containing ionic copper, indium, and selenium, and gallium in the approximate relative ratios of 1, 5, 1.5, and 5, respectively;

inserting said substrate into said electrodeposition bath; and forming a thin film layer by simultaneously electrodepositing copper, indium, selenium and gallium from said electrodeposition bath onto said substrate.

11. The process of claim 10 further comprising the step of:
depositing by physical vapor deposition additional material selected from the group consisting of copper, indium, gallium, and selenium, onto said thin film layer to achieve a final stoichiometry for said thin film layer and said additional material, combined, of approximately $Cu_1(In_{1-x}Ga_x)Se_2$ where x is within the range of 0 to 1, inclusive.

12. The process of claim 10 wherein:
said electrodeposition proceeds at an electrodeposition potential comprising a DC component of at least 0.5 volt.

13. The process of claim 12 wherein:
said electrodeposition potential further comprises an AC component of at least 1.0 volt at a frequency of at least 1 KHz.

14. The process of claim 12 wherein said electrodeposition potential further includes an AC component of at least 0.5 volt.

15. A process for preparing a photovoltaic device gallium-containing precursor film, the process comprising the steps of:

providing a substrate;

providing an electrodeposition bath comprising approximately 0.01–0.02M copper ions, 0.05–0.15M indium ions, 0.05–0.15M gallium ions, and 0.01–0.03M selenium ions inserting said substrate into said electrodeposition bath;

forming a metal-containing film by simultaneously electrodepositing at least three elements from said electrodeposition bath onto said substrate; and depositing by physical vapor deposition additional material selected from the group consisting of copper, indium, gallium, and selenium, onto said metal-containing film to achieve a final stoichiometry for said metal-containing film and said additional material, combined, of approximately $Cu_1(In_{1-x}Ga_x)Se2$ wherein x is within the range of approximately 0.34 to 0.50.

16. The process of claim 15 wherein said electrodeposition bath further comprises at least 0.3M lithium chloride.

* * * * *